US006322116B1

(12) United States Patent
Stevens (10) Patent No.: US 6,322,116 B1
(45) Date of Patent: Nov. 27, 2001

(54) NON-CONTACT END EFFECTOR (75) Inventor: Ronald R. Stevens, Scottsdale, AZ (US)

(73) Assignee: ASM America, Inc., Phoenix, AZ (US)

( * ) Notice: Subject to any disclaimer, the term of this patent is extended or adjusted under 35 U.S.C. 154(b) by 0 days.

(21) Appl. No.: 09/361,037

(22) Filed: Jul. 23, 1999

(51) Int. Cl.[7] ............................. B25J 15/06; B65G 49/07
(52) U.S. Cl. ......................................... 294/64.3; 414/941
(58) Field of Search .......................... 294/1.1, 64.1–65; 414/737, 752.1, 941; 901/40; 269/21

(56) References Cited

U.S. PATENT DOCUMENTS

| 3,523,706 | 8/1970 | Logue . |
| 3,539,216 | 11/1970 | Forcier . |
| 3,627,590 | 12/1971 | Mammel . |
| 4,118,058 | 10/1978 | Rahn et al. . |
| 4,257,637 | * 3/1981 | Hassan et al. ...................... 294/64.3 |
| 4,667,076 | 5/1987 | Amada . |
| 4,738,748 | 4/1988 | Kisa . |
| 4,773,687 | 9/1988 | Bush et al. . |
| 5,169,196 | 12/1992 | Safabakhsh . |
| 5,324,155 | 6/1994 | Goodwin et al. . |
| 5,746,460 | * 5/1998 | Marohl et al. ...................... 414/941 |
| 5,765,889 | * 6/1998 | Nam et al. ......................... 414/941 |
| 5,765,890 | * 6/1998 | Gaylord et al. ...................... 294/65 |
| 5,967,578 | * 10/1999 | Frey ................................... 294/64.3 |
| 6,099,056 | * 8/2000 | Siniaguine et al. ................ 294/64.3 |

OTHER PUBLICATIONS

IBM Technical Disclosure Bulletin; vol. 22, No. 8A; Jan. 1980; by R.D. Coles; "Self–Centering Non–Contact Pick–Up".

* cited by examiner

Primary Examiner—Dean J. Kramer
(74) Attorney, Agent, or Firm—Knobbe, Martens, Olson & Bear, LLP (57) ABSTRACT

A device that supports a substrate in a non-containing manner so as to controllably move the substrate within a substrate processing system. The device includes an end effector carrying support pads each having a vertical gas outlet and a horizontal outlet communicating with a gas supply to form a plurality of vertical gas jets and a plurality of horizontal gas jets. The vertical gas jets impinge on a lower surface of the substrate to urge the substrate into a fixed vertical position with respect to the support pads and the horizontal gas jets impinge on the substrate edge to urge the substrate into a fixed horizontal position with respect to the pads.

22 Claims, 11 Drawing Sheets

NON-CONTACT END EFFECTOR

BACKGROUND OF THE INVENTION

1. Field of the Invention

The present invention relates to substrate handling systems and, in particular, relates to non-contact end effectors for transferring substrates.

2. Description of the Related Art

Integrated circuits which comprise many semiconductor devices, such as transistors, diodes, and resistors, are often fabricated on a thin slice of semiconductor material, otherwise known as a substrate. These semiconductor devices are often formed in the substrate in an epitaxial process or a doping process that involves positioning the substrate in a plurality of high temperature chambers where exposed portions of the substrate are exposed to high temperature doping gases which results in doped layers being selectively formed in the device. Consequently, when forming such integrated circuits, it is often necessary to remove the substrate from one high temperature chamber having a first doping or epitaxial species and reposition the hot substrate having a temperature as high as 900° degrees Celsius to another high temperature chamber having a different doping or epitaxial species. However, since the substrate is extremely brittle and vulnerable to particulate contamination, great care must be taken so as to avoid physically damaging the substrate while it is being transported, especially when the substrate is in a heated state.

To avoid damaging the substrate during the transport process, various well known semiconductor substrate end effectors have been developed. In particular, one class of end effectors, known as Bernoulli wands, are used for transporting very hot substrates. The advantage provided by the Bernoulli wand is that the hot substrate generally does not contact the pickup wand, except perhaps at one or more small locators positioned on the underside of the wand. Such a Bernoulli wand is shown in U.S. Pat. No. 5,080,549 to Goodwin, et al.

In particular, when positioned above the substrate, a plurality of gas jets that emanate from a lower surface of the Bernoulli wand create an airflow pattern above the substrate so as to cause the atmospheric pressure immediately above the substrate to be less than the atmospheric pressure immediately below the substrate. Consequently, the pressure imbalance causes the substrate to experience an upward "lift" force. Moreover, as the substrate is drawn upward toward the wand, the same jets that produce the lift force produce an increasingly larger repulsive force that prevents the upper surface of the substrate from substantially contacting the lower surface of the Bernoulli wand. Thus, the substrate is forced into a state of levitation at a vertical equilibrium position below the lower surface of the Bernoulli wand.

To engage the substrate in a horizontal manner, the plurality of gas jets that emanate from the lower surface of the Bernoulli wand are adapted to have a lateral bias. Thus, the substrate experiences a lateral force that results in the substrate being pinned against the small locators of the Bernoulli wand that extend below the lower surface of the Bernoulli wand. Consequently, although contact between the upper surface of the substrate and the lower surface of the Bernoulli wand is avoided, a portion of a side surface of the substrate often contacts the locators of the Bernoulli wand.

Although Bernoulli wands known in the art are able to manipulate very hot substrates, they require a relatively large gas flow rate that can exceed 90 liters per minute. Since typical gas supply systems may include undesirable particles in the flow of gas, it is possible for such gas flows to adversely affect the substrate. In addition, the high gas flow will agitate otherwise settled particles that exist within system. Although the effects of particle contamination can sometimes be reduced by utilizing pressurized gas systems having relatively low levels of particle contamination, such gas systems usually require a significant financial expense.

Another disadvantage of some Bernoulli wands is that they are relatively expensive to manufacture. In particular, the typical Bernoulli wand is comprised of a pair of quartz plates that are fused together in a relatively expensive process to form a composite structure having an integrated network of gas channels formed between the quartz plates. Furthermore, since the gas flow pattern produced by the Bernoulli wand is relatively complicated, the network of gas channels formed within the quartz plates must be formed in an elaborate manner, thereby increasing the manufacturing costs even further.

A further disadvantage of using Bernoulli wands is that the side surface of the substrate is contacted by the Bernoulli wand. In particular, such contact can cause the substrate to experience thermal shock at the region of contact, which can possibly damage a significant portion of the substrate. Furthermore, such contact can enable contaminants inadvertently deposited on the locators of the Bernoulli wand to be transferred to the substrate, thereby limiting the yield of the semiconductor processing system.

As an alternative to Bernoulli wands, spatula-type end effectors are sometimes used in the semiconductor processing industry. In particular, spatula end effectors are formed with a flat upper surface that is adapted to engage a lower surface of the substrate. Specifically, the upper surface of the spatula is positioned below the lower surface of the substrate so that three or more pins that extend above the upper surface of the substrate spatula are allowed to contact the lower surface of the substrate so as to support the substrate. Thus, frictional engagement between the pins of the spatula and the lower surface of the substrate help to prevent the substrate from sliding with respect to the spatula during movement of the spatula.

However, since typical substrate spatulas directly contact the lower surface of the substrate, the initially hot substrate must be allowed to cool before it can be engaged by the substrate spatula so as to avoid unacceptable damage to the substrate. Since the initial temperature of the substrate can be as high as 1200° degrees Celsius and the acceptable handling temperature is around 500–600° degrees Celsius, the cooling period can be considerable. Thus, prior art semiconductor processing systems that utilize typical substrate spatulas often suffer from limited production capacity due to the foregoing cooling delays.

From the foregoing, it will therefore be appreciated that there is a need for a relatively inexpensive end effector that is capable of supporting and moving a very hot semiconductor substrate or other substrate in a non-contaminating manner so as to improve the product quality and production capacity of known substrate processing systems. To this end, there is a need for an improved end effector that utilizes a greatly reduced flow of gas to support and move the substrate in a substantially non-contacting manner.

SUMMARY OF THE INVENTION

The aforementioned needs are satisfied by a robotic substrate or substrate support device of the present invention that receives a flow of gas to support a substrate from below. The device includes an end effector having a plurality of gas outlets that communicate with the gas supply and create a plurality of gas jets to support the substrate while the end effector is stationary and while it is moving. In one arrangement, a plurality of substrate support pads are provided, each having at least one outlet from which at least one gas jet emanates so as to collectively form a plurality of gas jets. The support pads are positioned about the device so as to enable the gas jets to support the substrate in a vertical manner and stabilize the substrate in a horizontal manner during movement of the end effector.

In a primary aspect of the invention, each of the support pads has an outlet from which a vertical gas jet emanates and each has an outlet from which a horizontal gas jet emanates so as to collectively provide a plurality of vertical gas jets to support the substrate and a plurality of horizontal gas jets that impinge the edge of the substrate to horizontally stabilize it.

The foregoing structure provides a desirable method of supporting a substrate in a substantially noncontacting manner. The horizontal jets keep the substrates spaced from the end effector when the end effector is moved horizontally.

From the foregoing it should be apparent that the non-contact end effector of the present invention enables a substrate to be moved in a more effective manner. Advantageously, the system utilizes less gas flow than a Bernoulli wand employs. These and other objects and advantages of the present invention will become more apparent from the following description taken in conjunction with the accompanying drawings.

DETAILED DESCRIPTION OF THE PREFERRED EMBODIMENT

Figure 1:
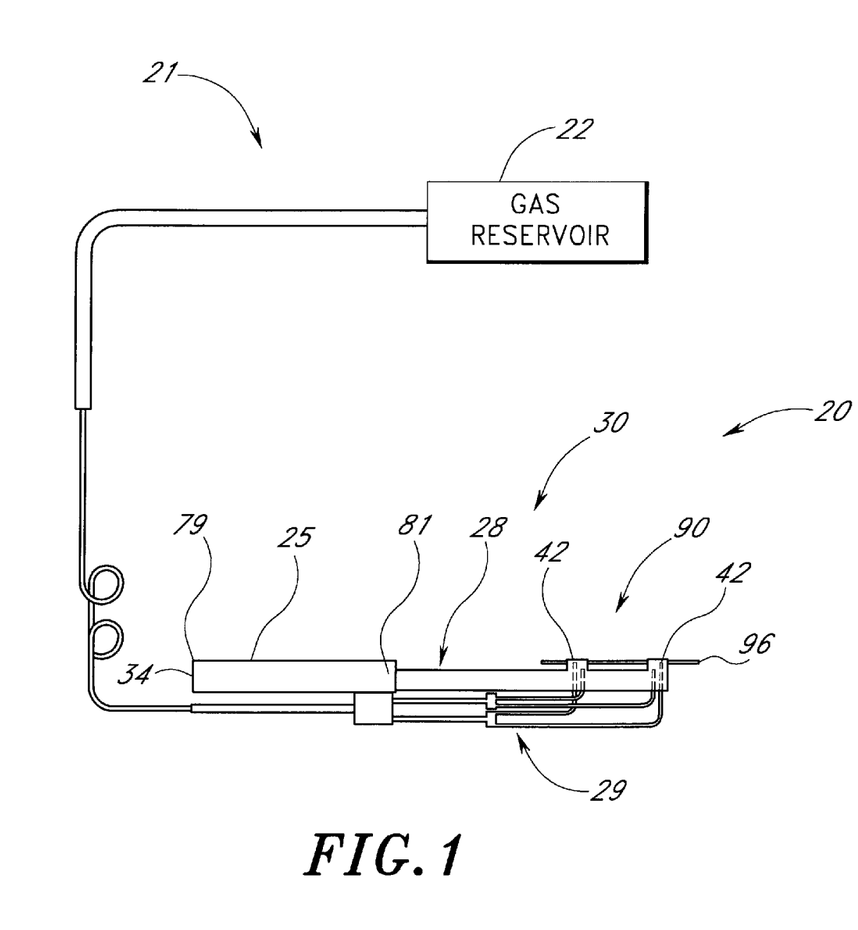
FIG. 1 generally schematically illustrates the substrate transport system of the present invention that includes an improved substrate support device.
Figure 2A:
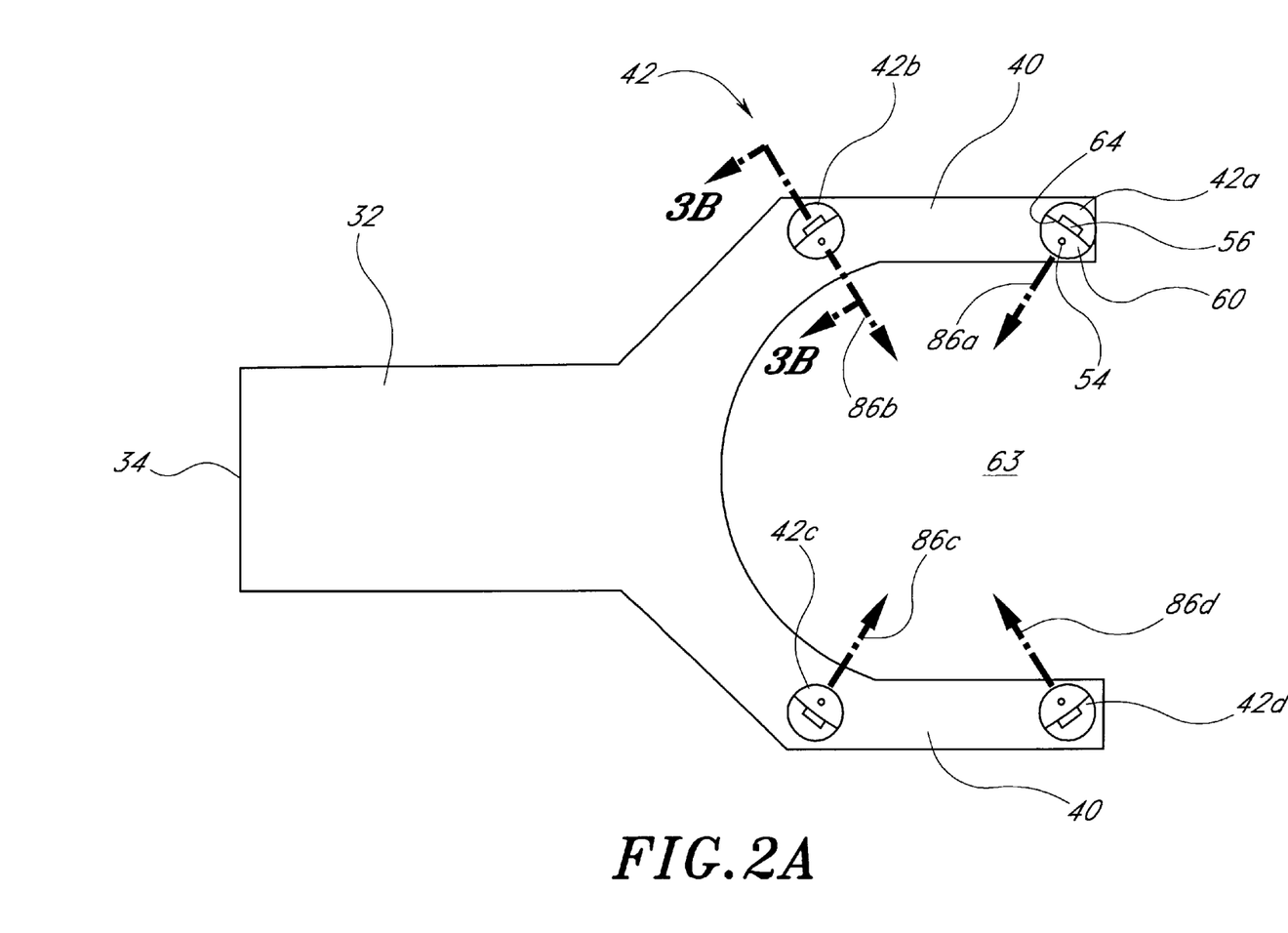
FIG. 2A is a top plan view of the support device of FIG. 1.
Figure 3A:
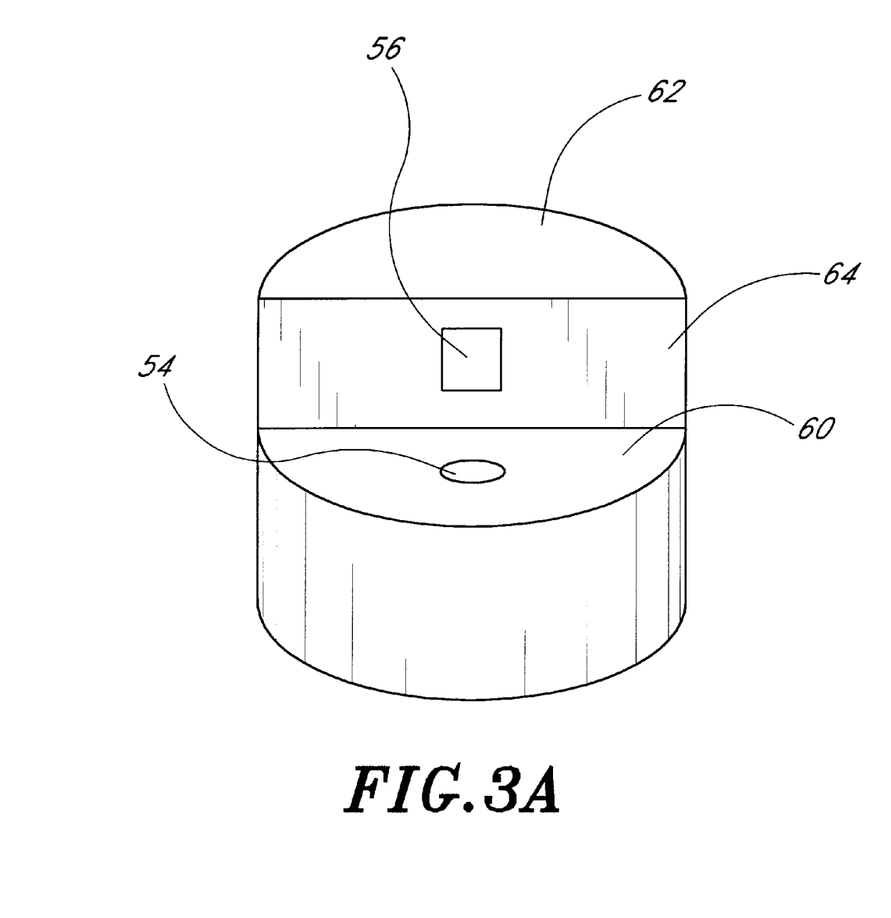
FIG. 3A is a magnified perspective view of a substrate support pad of the support device of FIG. 1 which illustrates the support pad in isolation.
Figure 3B:
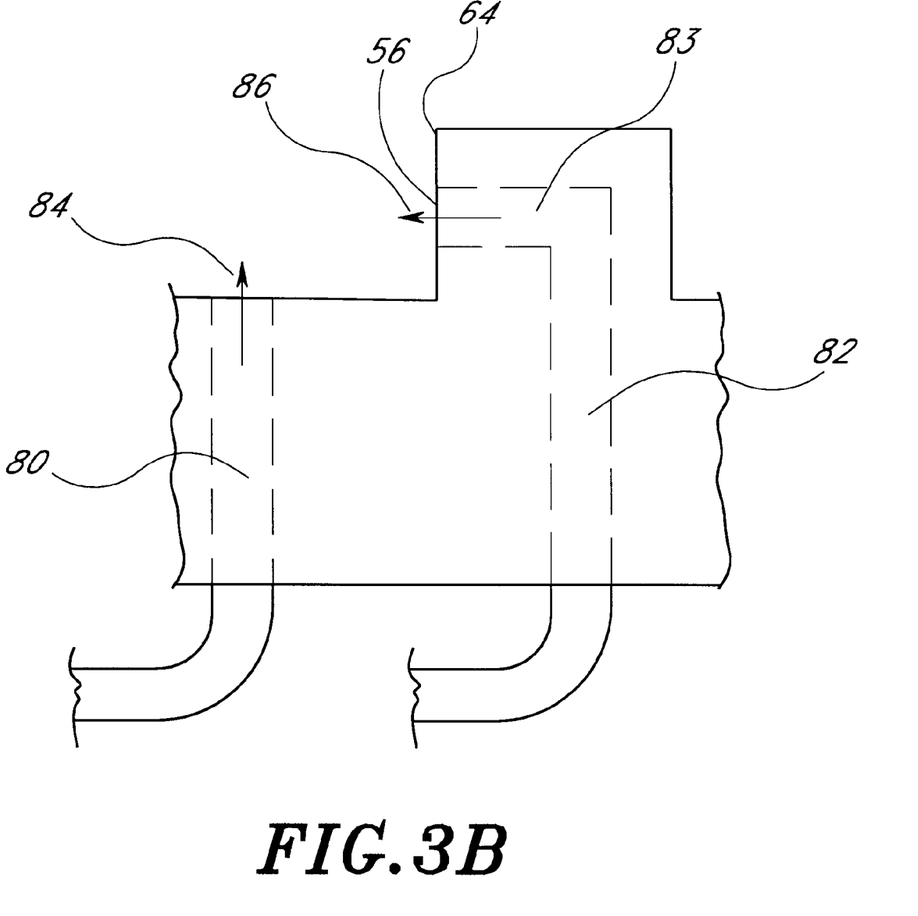
FIG. 3B is a magnified side view along the line 3B—3B of FIG. 2A which illustrates a support pad of the device of FIG. 1 in greater detail.

Referring to FIGS. 1, 2A, and 3B, a substrate transport system 20 is schematically shown comprising a support device 30 or end effector that is adapted to support a substrate 90 by directing gas jets 84 and 86 toward the substrate. The jets suspend the substrate above the support device so that the substrate does not contact the device. The support device includes a plurality of support pads 42 that produce the gas jets, a gas distribution assembly 29 that conducts gas to the pads, and an assembly 28 that supports the pads and the gas distribution assembly 29. The transport system further includes a gas supply assembly 21 having a reservoir 22 and a flexible gas conduit extending from the reservoir to the gas distribution assembly 29.

The transport system 20 includes a schematically illustrated robotic arm 25 having a drive end 79 and a support end 81. The drive end is adapted to be mounted to structure (not shown) of a substrate processing system which enables the arm 25 to move in a desired manner to enable the support end 81 carrying the substrate to be manipulated in a multi-dimensional manner.

Figure 2B:
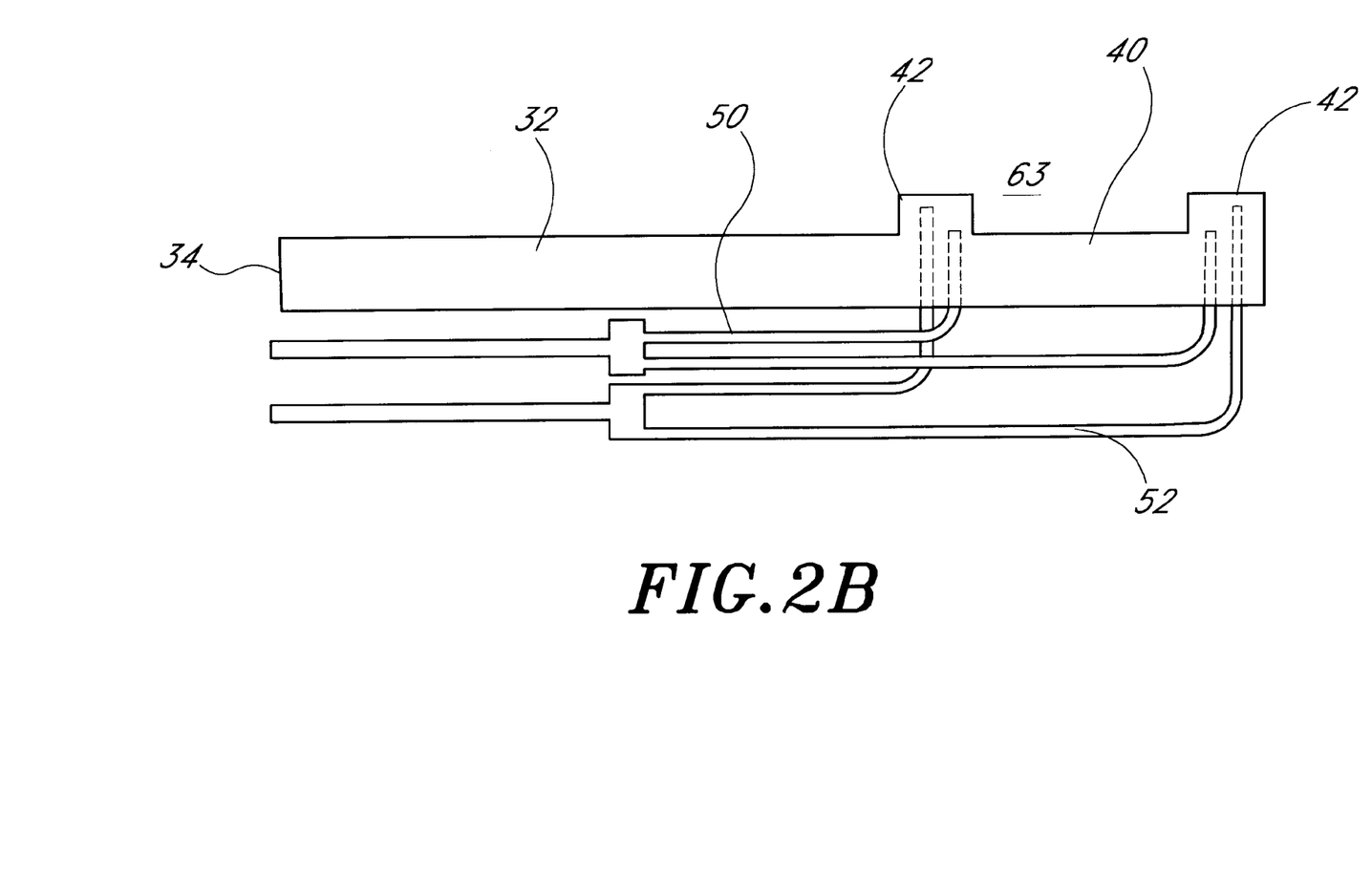
FIG. 2B is a side elevational view of the support device of FIG. 1.

As shown in FIGS. 2A and 2B, the structural support assembly 28 of the substrate support device 30 includes a fork-shaped tool having a rigid arm 32 which branches into a pair of spaced fingers 40 creating a generally U-shape. A rear end 34 of the tool is adapted to engage with the robotic arm in a known manner so as to enable the support device to be controllably moved.

As shown in FIGS. 2A, 2B, and 3B, the plurality of support pads 42 are mounted on the upper surface of the tool fingers 40. A plurality of conduits 50 and 52 conduct gas to the pads 42. Each pad preferably includes a generally horizontal surface 60 having a gas outlet 54 and a generally vertical surface 64 extending upwardly from the surface 60 and having a gas outlet 56. In the embodiment of FIG. 2A, the support pads 42 include four pads 42a, 42b, 42c, and 42d that are uniformly spaced to define a centrally located space 63 adapted to receive the disc-shaped substrate 90 so as to enable the substrate support pads 42 to cooperate with the substrate. Two of the pads 42a and 42d are respectively positioned on the tips of the fingers 40, and the other two are respectively spaced rearwardly from the tips. The pads 42a and 42c are oriented so that the vertical surfaces 64 face toward the center of the space 63 defined by the pads and face towards each other, thereby directing gas jets 86a and 86c toward the center of the space 63. The pads 42b and 42d are similarly oriented to direct the gas jets 86b and 86d toward the center of the space.

In the embodiment of FIG. 2A, the upper surface of the fingers 40 and the surface 60 of the support pad 42 are substantially aligned in a common plane. However, it will be appreciated that in another embodiment, the surface 60 of the support pad could be raised above the upper surface of the end effector fingers 42. As shown in FIG. 3B, the passage 80 is generally vertically oriented so that the gas jet 84 emanates substantially vertically.

Figure 4A:
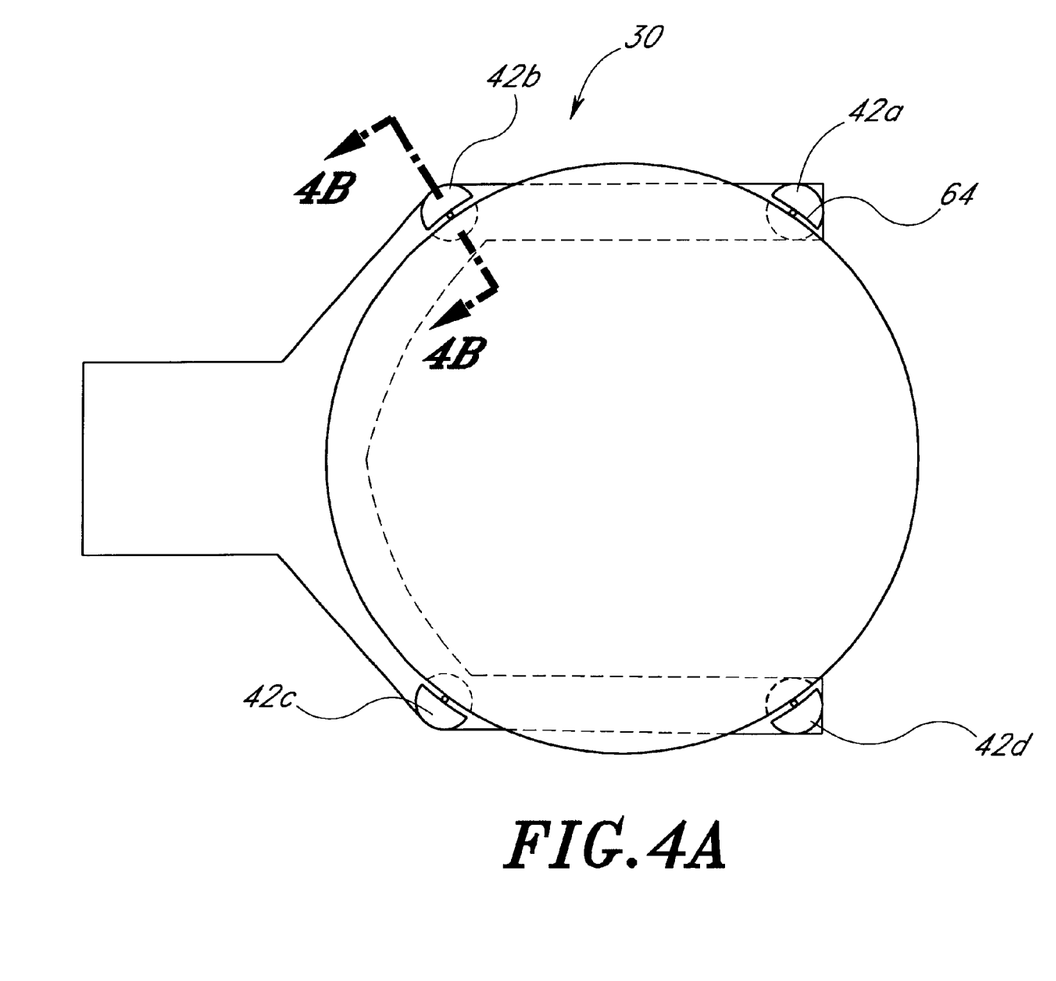
FIG. 4A is a top plan view of the support device of FIG. 1 engaged with a substrate.
Figure 4B:
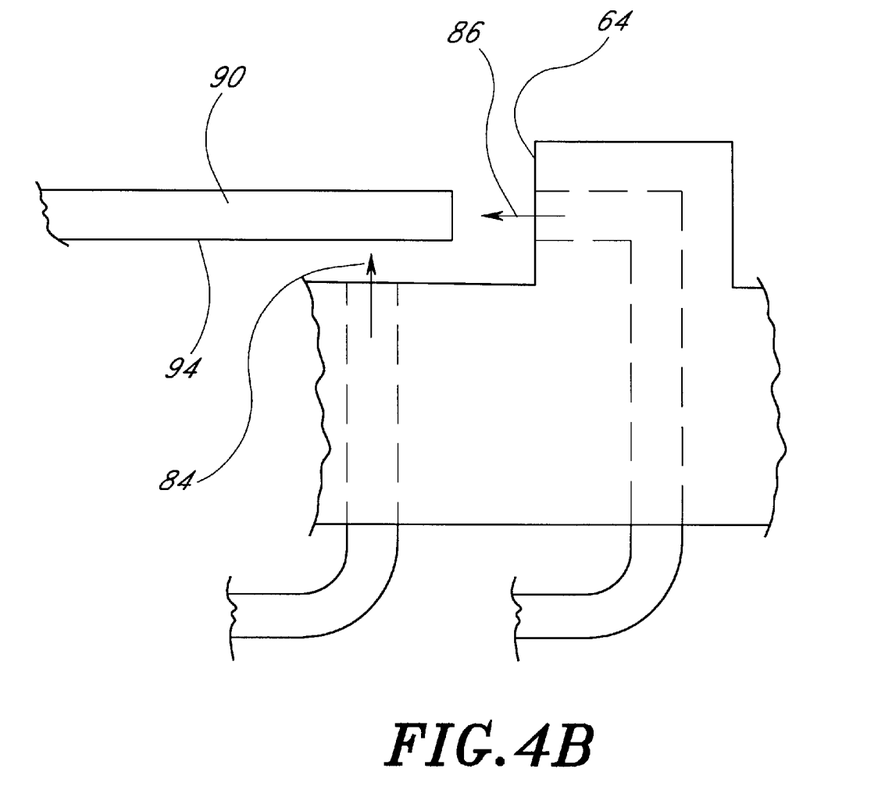
FIG. 4B is a magnified side view along the line 4B—4B of FIG. 4A which illustrates a support pad of FIG. 1 in greater detail.

As shown in FIGS. 3A and 3B, each support pad 42 includes an upwardly extending projection 62 having a channel 83 formed therein that joins with the channel 82. The passage 83 is oriented generally perpendicular to the vertical surface 64 so that the gas jet 86 that emanates from the outlet 56 is substantially perpendicular to the surface 64. The center of the outlet 56 is positioned above the pad surface 60 so that the gas jet 86 will substantially impinge upon an edge 96 of the substrate, when the substrate is supported by the gas jets 84. As shown in FIG. 4B, each of the vertical jets 84 impinges on outer portions of the lower surface 94 of the substrate so as to provide the substrate with a net upward force that matches the weight of the substrate. Thus, the substrate is vertically supported in a raised equilibrium position that results in the lower surface of the substrate being elevated above the pad horizontal surface 60 and the upper surface of the end effector support fingers 40. Further, the vertical jets 84 are adapted to provide the substrate with a restoring torque if the substrate is not aligned with the plane of the pad surfaces 60 so as to urge the substrate to be substantially parallel with the plane of the end effector fingers 42. Thus, if the substrate is initially positioned so that its plane is not parallel with the plane of the support pads, the vertical jets 84 will realign the substrate so that the substrate becomes properly aligned.

As also seen in FIG. 4B, the vertical jets are configured so that the substrate is urged into a vertical equilibrium position that aligns the substrate edges with the horizontal jets 86. Since each of the horizontal jets are directed toward the center of the substrate, the jets 86*a* and 86*b* counteract the opposing jets 86*c* and 86*d*, respectively, the substrate is forced to settle into a centrally located horizontal equilibrium position. Thus, the substrate edges are prevented from contacting the vertical surfaces 64 of the support pads.

This arrangement also permits the substrate to be moved in a noncontacting manner. In particular, if the end effector is moved, the pads 42 will move with respect to the substrate, thereby disrupting the condition for static equilibrium of the substrate. Consequently, instead of experiencing zero net force, the substrate will experience a force that urges the substrate to move with the end effector. For example, referring to FIG. 4A, if the support device 30 is moved from left to right, the support pads 42*b* and 42*c* will move closer to the substrate and the pads 42*a* and 42*d* will move further from the substrate. Consequently, the horizontal forces caused by the horizontal jets 86*b* and 86*c* will overcome the horizontal jets 86*a* and 86*b*, resulting in a net force that acts on the substrate from left to right so as to move the substrate from left to right. However, if the acceleration of the support device 30 exceeds a threshold value, the net force provided by the horizontal jets 86 will not be sufficient to match the acceleration of the substrate with the acceleration of the support device. In this case, contact will occur between edges of the substrate and the vertical surface 64 of one or more of the support pads so as to move the substrate with the support device in a contacting manner.

In one embodiment of the invention, the support device 30 is substantially formed of quartz so as to enable the device to withstand the higher temperatures associated with semiconductor processing.

In another embodiment, the support device 30 is at least partially formed of silicon carbide which can handle the high temperature and has good heat absorbing qualities. In particular, the structural support assembly 28 and the support pads 42 are formed of silicon carbide. Thus, when the hot substrate 90 is engaged by the cooler support device 30, the support device 30 will absorb a much greater amount of radiant heat emitted from the substrate, then does quartz. Consequently, the substrate will cool at an increased rate.

In one embodiment, the plurality of support pads 42 are integrally formed with the platform 38 of the structural support assembly 28 of the support device 30 so as to simplify the method of producing the support device 30. In another embodiment, the plurality of support pads 42 are detachably mounted to the structural support assembly 28 so as to allow the pads 42 to be easily modified, easily replaced and easily upgraded as needed.

Although the preferred embodiment utilizes the jets 84 to vertically engage the substrate and the jets 86 to horizontally engage the substrate, it will be appreciated that, in another embodiment, the jets 84 and 86 could be configured differently. In particular, the jets 84 and 86 could both be adapted with vertical and horizontal components so as to enable the support device 30 to engage and move the substrate in the manner of the substrate support device 30 of FIG. 1.

It will therefore be appreciated that the substrate support device 30 is able to utilize a relatively small gas flow to effectively engage the substrate in a non-contacting manner. Thus, the substrate is exposed to reduced levels of gas contaminates and is able to be manipulated at a reduced financial expense. Furthermore, since contact between the support device 30 and the substrate is avoided, the substrate is less likely to experience thermal shock and less likely to be contaminated by contaminants formed on the support device 30.

It will also be appreciated that the support device 30 can be manufactured in a manner that is substantially less expensive than some Bernoulli wands. In particular, the substrate support pads 42, the structural support assembly 28, and the gas distribution assembly 29 can all be formed from quartz material in a manner that does not require expensive fusing techniques.

Figure 5A:
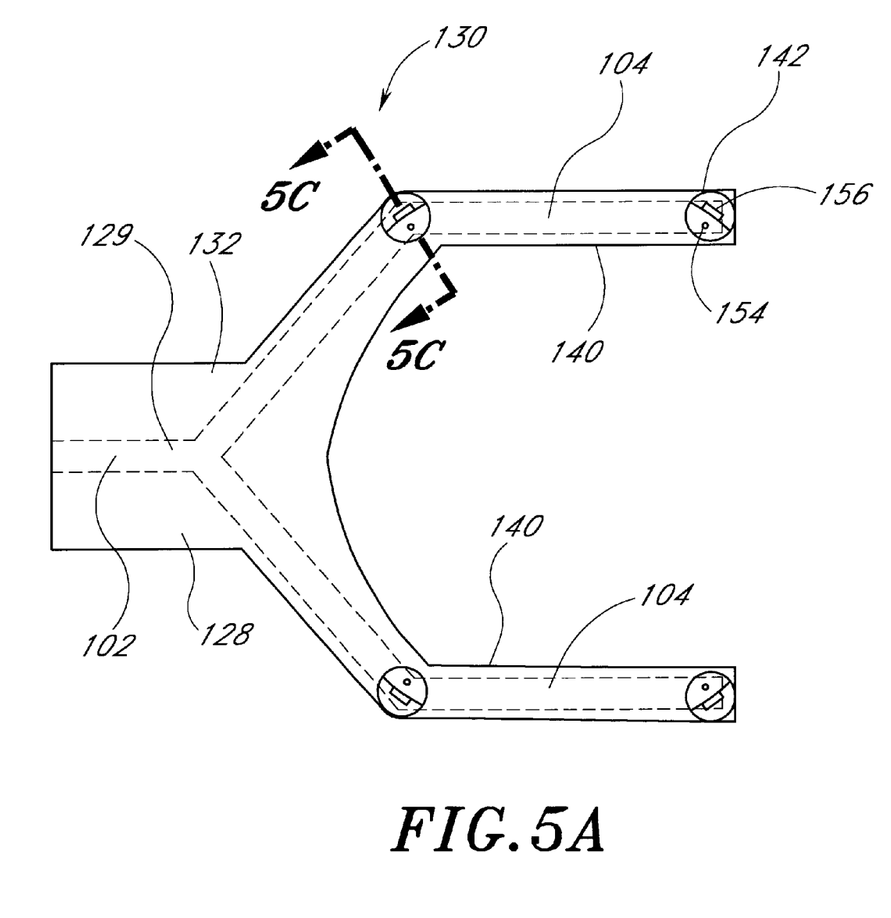
FIG. 5A is a top plan view of an alternative embodiment a support device.
Figure 5B:
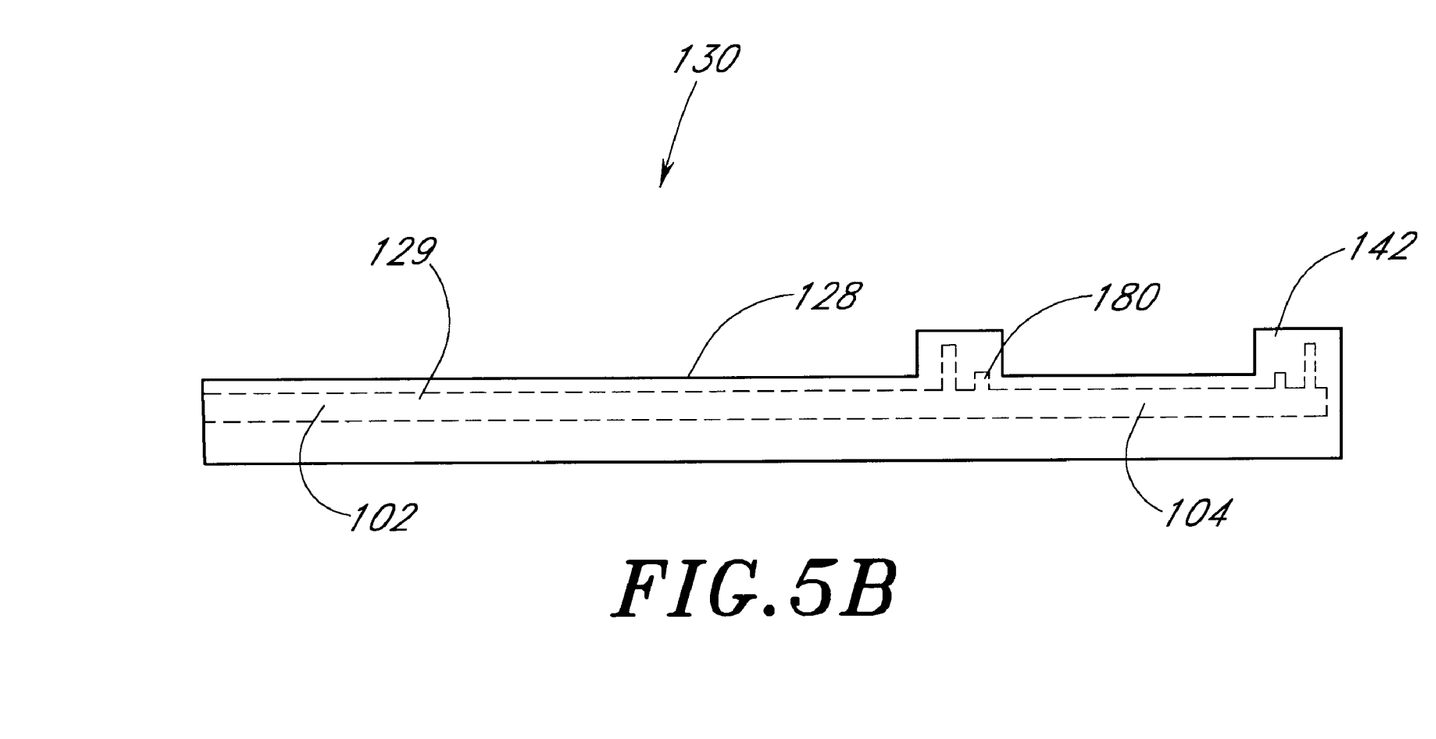
FIG. 5B is a side view of the support device of FIG. 5A.
Figure 5C:
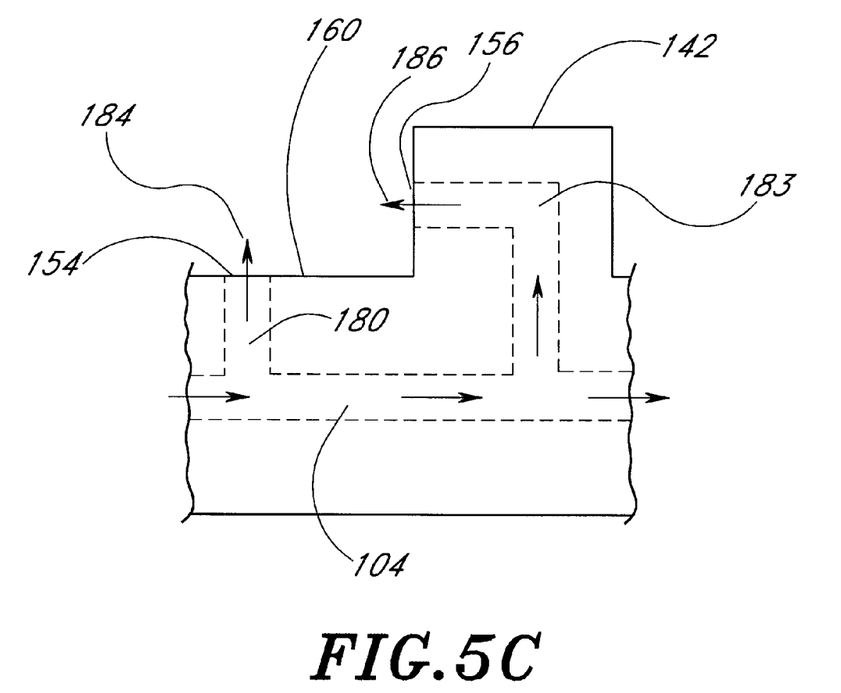
FIG. 5C is a side view along the line 5C—5C of FIG. 5A illustrating a support pad of the device of FIG. 5A in greater detail.

Referring to FIGS. 5A and 5B, there is shown a support device 130 that is similar to the support device 30 except that the gas distribution assembly 129 is integrally formed within the structural support assembly 128. The gas distribution assembly 129 includes the primary interior channel 102 in the arm 132 and two secondary interior channels 104, in the fingers 140. Each of the channels 104 extends along the corresponding finger 140 to be located below one or more of the support pads 142. As shown in FIG. 5C, a channel 180 extends from the gas outlet 154 to the enclosed channel 104 along a direction that is perpendicular to the surface 160 of the pad 142. Similarly, channels 183 connect the channel 104 to the gas outlet 156 so as to form the gas jet 186.

Figure 6:
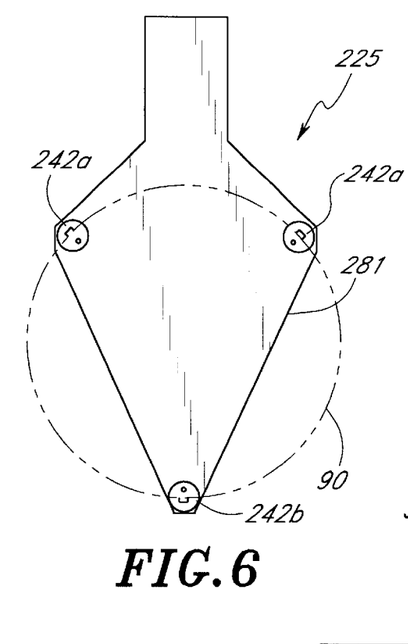
FIG. 6 is schematic, plan view of a substrate support device illustrating an alternate form of the invention.

FIG. 6 illustrates another embodiment of the invention wherein a robotic arm 225 is formed with a generally triangular shaped support end 281, with two corners of the triangle being positioned to the rear of the support end and the third corner forming the center tip of the support end. A pair of substrate support pads 242*a* are respectively positioned on the rear corners of the support end and a third 242*b* is positioned on the outer tip. As with the previously descried embodiment, the horizontal outlets in those support pads are directed towards the center of the circular substrate 90 shown in broken lines. Further, the pad 242*b* is centrally positioned with respect to the rear pads 242*a*. Thus, the gas jets emanating from the support pad outlets are suitably balanced.

Figure 7:
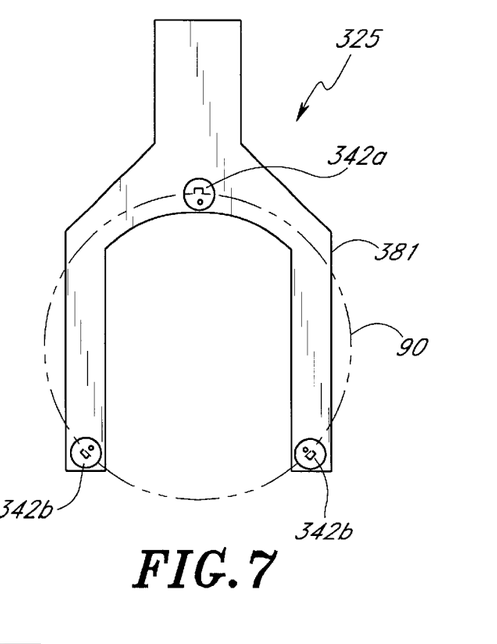
FIG. 7 is a schematic, plan view of a substrate support device illustrating another form of the invention.

FIG. 7 illustrates an embodiment of the invention wherein the support end 381 of an end effector 325 is shaped like the end effector of FIG. 2A, but only three substrate support pads 342 are utilized, as in the arrangement of FIG. 6. However, in this situation, a single support pad 342*a* is centrally positioned on the rear portion of the support end 381, and a pair of support pads 342*b* are respectively mounted on the outer tips of the support end 381. Again the pads are arranged so the gas jets produced are suitably balanced.

Figure 8:
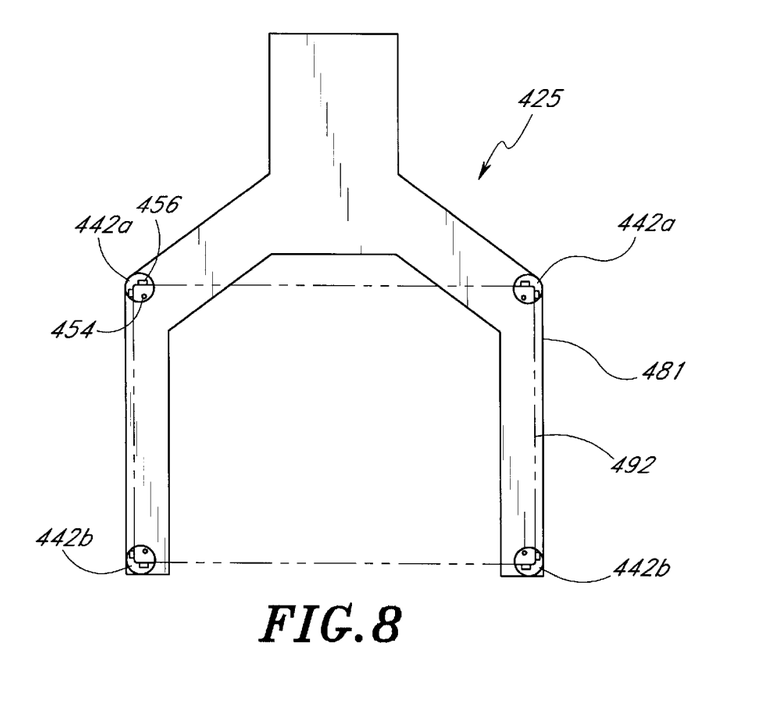
FIG. 8 is a schematic, plan view of an alternate form of a support device of the invention supporting a rectangular substrate.

FIG. 8 illustrates an end effector 425 having a forked shape similar to that of FIG. 2A, and also employs four substrate support pads 442 with a pad 442a positioned on the rear portion of each support finger, and a support pad 442b positioned on the forward tip of each finger. However, in this instance, the support pads are formed and arranged to support a rectangular substrate 492. To provide a rectangular receiving space, each pad includes an upper portion having an inner 90° cut-out portion having a horizontal surface with a gas outlet 454 therein for providing vertical jets for supporting the substrate. The upper portion includes a horizontal outlet 456 in each vertical surface defining the 90° cut-out portion. These horizontal outlets provide horizontally directed jets for impinging against the edges of a rectangular substrate. As can be seen each horizontal outlet has an opposing outlet 456 on an adjacent pad so that collectively the eight horizontal outlets are balanced with respect to the substrate. As mentioned above, different gas outlet configurations can be employed so long as the desired effect is obtained.

Although the above embodiments of the present invention illustrate novel features of the invention, it will be understood that various omissions, substitutions and changes in the form of the detail of the devices illustrated may be made by those skilled in the art without departing from the spirit of the present invention. Consequently, the scope of the invention should not be limited to the foregoing description, but should be defined by the appended claims.

What is claimed is:

1. An end effector device for transporting a thin, flat substrate, comprising:
    a movable support including structure to extend beneath said substrate; and
    a plurality of gas outlets in said structure to provide a plurality of gas jets positioned to support the substrate in a vertical manner and stabilize the substrate in a horizontal manner during movement of the support, wherein said structure includes a plurality of substrate support pads, each of which includes at least one of said gas outlets, and wherein at least one of the plurality of gas jets impinges a lower surface of the substrate so as to vertically support the substrate, and wherein at least one of the plurality of gas jets impinges an edge of the substrate so as to limit horizontal movement of the substrate with respect to said pads.

2. The device of claim 1, wherein movement of the support causes the substrate to move in a manner that prevents the support from contacting the substrate.

3. The device of claim 2, wherein the at least one gas outlet of each of said pads include first and second gas outlets.

4. The device of claim 3, wherein the first outlets form substantially vertical gas jets and the second outlets form substantially horizontal gas jets.

5. The device of claim 4, wherein the vertical gas jets impinge the lower surface of the substrate so that the substrate is supported at a first elevated vertical position with respect to the support, and wherein each of the plurality of horizontal gas jets impinges an edge of the substrate when the substrate is vertically positioned at the first vertical position so that the substrate is horizontally stabilized.

6. The device of claim 3, wherein each of the said pads includes a generally horizontal surface and an adjacent upwardly extending surface, wherein one of said gas outlets is located in each of said surfaces.

7. An end effector device for transporting a thin, flat substrate, comprising:
    a movable support including structure to extend beneath said substrate; and
    a plurality of gas outlets in said structure to provide a plurality of gas jets positioned to support the substrate in a vertical manner and stabilize the substrate in a horizontal manner during movement of the support, wherein said structure includes a plurality of substrate support pads, each of which includes at least one of said gas outlets, wherein said substrate pads include a first, second, third, and fourth substrate support pad with each having an outlet providing a vertical gas jet and an outlet providing a horizontal gas jet.

8. The device of claim 7, wherein the movable support includes a pair of spaced support fingers, and said first and second pads are positioned on one finger and said third and fourth pads are positioned on the other finger.

9. The device of claim 8, wherein said first and third pads are positioned so that the corresponding first and third horizontal gas jets oppose each other, and wherein said second and fourth pads are positioned so that the corresponding second and fourth horizontal gas jets oppose each other.

10. The device of claim 9, wherein a displacement of said support with respect to the substrate caused by an acceleration of the support results in the plurality of horizontal gas jets collectively forming a force which urges the substrate to accelerate along with the support.

11. An end effector device for transporting a thin, flat substrate, comprising:
    a movable support including structure to extend beneath said substrate; and
    a plurality of gas outlets in said structure to provide a plurality of gas jets positioned to support the substrate in a vertical manner and stabilize the substrate in a horizontal manner during movement of the support, wherein said structure includes three substrate support pads, each of which includes at least one of said gas outlets, with the outlets of said three pads being spaced to stabilize the substrate in a horizontal manner during movement of the support, wherein one of said pads is positioned on an outer tip of said support structure and the other two said pads are positioned reaiwardly from the pad on the outer end.

12. The device of claim 11, wherein said support structure includes a pair of spaced fingers and one of said pads is positioned on the outer tip of each of said fingers, and a third one of said support pads is positioned rearwardly of said tips and centrally positioned with respect to said tips.

13. An end effector device for transporting a thin, flat substrate, comprising:
    a movable support including, structure to extend beneath said substrate; and
    a plurality of gas outlets in said structure to provide a plurality of gas jets positioned to support the substrate in a vertical manner and stabilize the substrate in a horizontal manner during movement of the support, wherein said structure includes a plurality of substrate support pads positioned and configured to define a rectangular space for receiving a rectangular substrate, each of said pads defining said space including a pair of outlets to provide generally horizontal oriented gas jets to engage adjacent sides of a corner of the rectangular substrate.

14. A substrate support device comprising:
    a horizontally movable support that receives a flow of gas from an external gas supply to engage a substrate; and
    a plurality of substrate support pads each having a first and a second gas outlet that communicates with a gas supply so that a vertical gas jet emanates from the first outlet and a horizontal gas jet emanates from the second outlet to collectively form a plurality of vertical gas jets and a plurality of horizontal gas jets, said pads being positioned about the support so that the vertical gas jets impinge a lower surface of the substrate to vertically support the substrate, and the horizontal gas jets impinge an edge of the substrate to horizontally stabilize the substrate.

15. The device of claim 14, wherein the pads are positioned so that horizontal jets are balanced to center the substrate.

16. The device of claim 14, wherein each of the pads includes a horizontal surface having an outlet providing a vertical gas jet, and a vertical projection having an outlet providing a horizontal gas jet.

17. A method of transporting a semiconductor substrate comprising the steps of:

positioning the substrate adjacent a substrate support having a plurality of gas outlets;

supplying gas to said outlets to produce a plurality of gas jets that vertically support the substrate above a first surface of said support and a plurality of gas jets that horizontally stabilize the substrate in a substantially non-contacting manner; and moving said support horizontally wherein said jets support the substrate vertically and horizontally during the movement and thereby move the substrate without contact with the support during the moving step.

18. The method of claim 17, wherein said support is on the end of a robotic arm having a drive end adapted to be mounted to a system which enables the arm to move in a desired manner to enable the support carrying the substrate to be manipulated in a multidimensional manner and said positioning step includes positioning the substrate on the substrate support.

19. A substrate transport system comprising:

a robotic arm having a drive end and a support end, the drive end being configured to be mounted in a manner to move the arm in a desired manner to enable the support end carrying a substrate to be manipulated in a multidimensional manner;

said support end including one or more fingers to extend beneath a substrate; and a plurality of gas outlets in said fingers to provide a plurality of gas jets positioned to support the substrate in a vertical manner and stabilize the substrate in a horizontal manner during horizontal movement of the arm;

wherein said fingers includes a pair of spaced fingers to define a fork-like paddle to extend beneath said substrate; and wherein said spaced fingers include horizontal portions for extending beneath the substrate and vertically oriented portions spaced to extend adjacent edges of the substrate.

20. The system of claim 19, wherein said outlets are configured so that displacement of the arm with respect to the substrate caused by horizontal acceleration of the arm results in a gas force which urges the substrate to accelerate with the arm.

21. The system of claim 19, wherein said plurality of gas outlets includes at least three outlets spaced to stabilize the substrate in a horizontal manner during movement of said arm.

22. A substrate transport system comprising:

a robotic arm having a drive end and a support end, the drive end being configured to be mounted in a manner to move the arm in a desired manner to enable the support end carrying a substrate to be manipulated in a multidimensional manner;

said support end including one or more fingers to extend beneath a substrate; and a plurality of gas outlets in said fingers to provide a plurality of gas jets positioned to support the substrate in a vertical manner and stabilize the substrate in a horizontal manner during horizontal movement of the arm;

wherein said gas outlets are oriented so that the gas jets impinge a lower surface of the substrate so as to vertically support the substrate; and wherein at least one of the outlets is oriented so that at least one of the gas jets impinges an edge of the substrate so as to limit horizontal movement of the substrate with respect to the outlets.

* * * * *